United States Patent
Hsieh

(10) Patent No.: US 8,178,922 B2
(45) Date of Patent: May 15, 2012

(54) TRENCH MOSFET WITH ULTRA HIGH CELL DENSITY AND MANUFACTURE THEREOF

(75) Inventor: Fu-Yuan Hsieh, Banciao (TW)

(73) Assignee: Force Mos Technology Co., Ltd. (TW)

( * ) Notice: Subject to any disclaimer, the term of this patent is extended or adjusted under 35 U.S.C. 154(b) by 268 days.

(21) Appl. No.: 12/656,038

(22) Filed: Jan. 14, 2010

(65) Prior Publication Data

US 2011/0169075 A1 Jul. 14, 2011

(51) Int. Cl.
*H01L 29/94* (2006.01)
(52) U.S. Cl. ........ 257/330; 257/331; 257/301; 257/302; 257/329; 257/E27.091
(58) Field of Classification Search ............... 257/330, 257/331, 302, 301, 329, E27.091, E27.095
See application file for complete search history.

(56) References Cited

U.S. PATENT DOCUMENTS

| 8,004,036 | B2 * | 8/2011 | Hsieh | 257/328 |
| 8,022,471 | B2 * | 9/2011 | Hshieh | 257/329 |
| 8,034,686 | B2 * | 10/2011 | Hsieh | 438/270 |
| 8,058,685 | B2 * | 11/2011 | Hsieh | 257/330 |
| 8,101,993 | B2 * | 1/2012 | Hsieh | 257/330 |
| 2010/0090270 | A1 * | 4/2010 | Hsieh | 257/328 |

* cited by examiner

*Primary Examiner* — Kiesha Bryant
*Assistant Examiner* — Tsz Chiu
(74) *Attorney, Agent, or Firm* — Bacon & Thomas, PLLC

(57) ABSTRACT

A trench MOSFET structure with ultra high cell density is disclosed, wherein the source regions and the body regions are located in different regions to save the mesa area between every two adjacent gate trenches in the active area. Furthermore, the inventive trench MOSFET is composed of stripe cells to further increase cell packing density and decrease on resistance Rds between the drain region and the source region.

15 Claims, 19 Drawing Sheets channel packing density (channel width per unit area)

$a/(a+b)$ stripe cell $4a/(a+b)^2$ closed cell a is mesa width; b is trench width

| channel packing density comparison | | |
|---|---|---|
| packing density | closed cell | stripe cell |
| when a > b | $4a/(a+b)^2$ > | $a/(a+b)$ |
| when a = b | $4a/(a+b)^2$ = | $a/(a+b)$ |
| when a < b | $4a/(a+b)^2$ < | $a/(a+b)$ |

Fig.3

TRENCH MOSFET WITH ULTRA HIGH CELL DENSITY AND MANUFACTURE THEREOF

FIELD OF THE INVENTION

This invention relates generally to the cell structure and device configuration of semiconductor devices. More particularly, this invention relates to an improved trench MOSFET configuration with ultra high cell density and manufacture thereof.

BACKGROUND OF THE INVENTION

It is known that channel packing density (channel width per unit area) and cell density play important roles in the aspect of improving the Performance/Area-cost ratio of trench semiconductor power device. Therefore, many kinds of trench semiconductor power devices were disclosed in prior arts trying to achieve higher channel packing density and cell density.

In U.S. Pat. No. 6,737,704, a trench MOSFET cell with source-body contact on inner circumferential surface was disclosed, as shown in FIG. 1. This cell was formed on an N+ substrate 100 on which a lightly doped N epitaxial layer 102 was grown. A plurality of trenched gates were formed inside said epitaxial layer 102 and each filled with doped polysilicon 104 in its lower portion over an gate oxide layer 108. Beside said trenched gates, there were P-body regions 112 inside which a plurality of n+ source regions 114 were formed in an active area and adjacent to the upper portion of said trenched gates sidewalls, and in the meanwhile, a plurality of P+ body contact regions 113 were formed surrounding said n+ source regions 114. A layer of front metal 118 was directly filled into upper portion of said trenched gates to contact said n+ source regions 114 and also contact said P-body regions 112 indirectly.

What should be noticed is that, the body contact regions 113 occupies a large amount of a mesa area locating between two adjacent trenched gates, which limits the increasing of cell density mentioned above. Besides, FIG. 2 and FIG. 3 lead to the conclusion that when the mesa width 'a' is smaller than the trench width 'b', a stripe cell design is better than a closed cell design due to higher channel packing density and resulted low on-resistance Rds (resistance between drain region and source region) in the stripe cell design. However, since the disclosed structure of the trench MOSFET in prior art is a closed cell design, even if the limitation of requiring large mesa area can be solved by improved technique, the lower channel packing density inherently led by the closed cell still have the problem of high on-resistance Rds.

In U.S. Pat. No. 7,402,863, another trench MOSFET cell with source-body contact on inner surface is shown in FIG. 3. Comparing to FIG. 1, in this prior art, an additional Ti/TiN layer 111 was added as barrier layer before the deposition of front metal layer 118', however, considering the disadvantage introduced above, nothing had been improved.

Accordingly, it would be desirable to provide a new and improved trench MOSFET configuration with high cell density and high channel packing density while improving the Performance/Area-cost ratio.

SUMMARY OF THE INVENTION

The present invention has been conceived to solve the above-described problems with the related art, and it is an object of the invention to provide a technique which makes it possible to reduce the area occupied by the mesa between two adjacent trenched gates in the active area, thereby following a reduction of the size of devices.

In order to solve the above-described problems, according to a first aspect of the invention, there is provided a trench semiconductor power MOSFET comprising a plurality of trench MOSFETs of stripe cells with each stripe cell comprising: a substrate of a first conductivity type; an epitaxial layer of said first conductivity type over said substrate and having a lower doping concentration than said substrate; a plurality of body regions of a second conductivity type inside upper portion of said epitaxial layer; a plurality of source regions of said first conductivity type in the active area and near top surface of said body regions and having a higher doping concentration than said epitaxial layer; a plurality of first gate trenches extending from the top surface of said source regions and reaching said epitaxial layer, said first gate trenches are surrounded by said source regions on their upper sidewalls, and each of said stripe cell only have said source region and said body region in the mesa area between two adjacent first gate trenches; a first insulation layer lining the lower inner surface of said first gate trenches; gate conductive layer filling partially within lower portion of said first gate trenches and close to said first insulation layer; a second insulation layer located inside of upper portion of said first gate trenches, covering top surface of said gate conductive layer and said first insulation layer, and on a part of top surface of said epitaxial layer; at least a body contact trenches arranged next to the edge of said active area, penetrating through said second insulation layer on a part of top surface of said epitaxial layer and extending into said body region; a first body contact region heavily doped with said second conductivity type inside said body region and wrapping at least the bottom of each said body contact trench, said first body contact region has a higher doping concentration than said body region; a first metal plug filling into upper portion of each of said first gate trenches and located onto said second insulation layer covering the top surface of said gate conductive gate and said first insulation layer; a second metal plug filling into each said body contact trench; a source metal formed on the top of said trench MOSFET and connected to said source region on top of said source region and on sidewalls of top portion of said first gate trenches as well via said first metal plug, said source metal is also connected to said body region via said second metal plug filling into each said body contact trench.

Briefly, in a present N-channel trench MOSFET according to the present invention, the P+ body contact region and the n+ source region are located in different regions, not in a same mesa area between two adjacent gate trenches in the active area, by employing this invention, unit cell pitch of the N-channel trench MOSFET can be reduced below 1.0 μm to achieve cell density higher than 1 Giga cells/in². On the other hand, the separation of the P+ body contact region and the n+ source region benefits to achieve device ruggedness without having Vth variation issue due to the P+ body contact region touching channel regions near said gate trenches. Besides, all cells in the N-channel trench MOSFET are stripe arranged, resulting in further increasing of channel packing density and decreasing of Rds referring to FIG. 2 and FIG. 3.

According to a second aspect of the present invention, there is provided a trench MOSFET of stripe cells with each stripe cell further comprises at least a second gate trenches located adjacent to said body contact trench and having a wider trench width than said first gate trenches. And, each said second gate trench is filled with said gate conductive layer padded by said first insulation layer within its lower portion while filled with said second insulation layer in its upper portion. Furthermore, each said strip cell comprises at least a gate contact trench penetrating through said second insulation layer and extending into said gate conductive layer within said second gate trench, and each said gate contact trench is filled with said second metal plug for connecting said gate conductive layer within each said second gate trench to a gate metal on top of said trench MOSFET.

According to a third aspect of the present invention, as shown in FIG. 9, FIG. 11 and FIG. 12, there is provided a trench MOSFET of stripe cells which further comprises a termination area composed of trenched floating rings comprising multiple of third gate trenches, and each of said third gate trenches is filled with said gate conductive layer padded by said first insulation layer within its lower portion while filled with said second insulation layer in its upper portion.

According to a fourth aspect of the present invention, as show in FIG. 6, FIG. 8, FIG. 11 and FIG. 12, there is provided a trench MOSFET of stripe cells with each stripe cell further comprises a second body contact region underneath each of said first body contact region, and said second body contact region has lower doping concentration than said first body contact region but has higher doping concentration than said body region. For example, in a preferred N-channel trench MOSFET, as shown in FIG. 6, a P+ body contact region is formed below a P++ body contact region which wraps at least the bottom of each said body contact trench, by doing this way, avalanche breakdown between the n+ source region and the drain region on rear side of said substrate will occur at P+/N (epitaxial layer) area first without triggering the parasitic N+(substrate)/P(body)/N(epitaxial layer) inherently in unit cell, thus improving avalanche capability by forming a clamp diode underneath trenched body contact.

According to a fifth aspect of the present invention, as shown in FIGS. 5~9 and FIG. 11, there is provided a trench MOSFET of stripe cells in which said source region in edge of said active area is not reaching the sidewalls of said body contact trench.

According to a sixth aspect of the present invention, as shown in FIG. 12, there is provided a trench MOSFET of stripe cells in which said source region in edge of said active area is reaching the sidewalls of said body contact trench.

According to a seventh aspect of the present invention, as shown in FIG. 5, FIG. 6, FIG. 9, FIG. 11 and FIG. 12, there is provided a trench MOSFET of stripe cells and in each stripe cell said first metal plugs and said second metal plugs are all tungsten plugs padded with a barrier layer of Ti/TiN or Co/TiN or Ta/TiN. Furthermore, the trench MOSFET further comprises a resistance reduction layer Ti or Ti/TiN padded beneath said source metal.

According to an eighth aspect of the present invention, as shown in FIG. 7 and FIG. 8, there is provided a trench MOSFET of stripe cells and in each stripe cell said first metal plugs are source metal filling directly into upper portion of said first trenched gates, said second metal plugs are tungsten plugs padded with a barrier layer of Ti/TiN or Co/TiN or Ta/TiN.

According to a ninth aspect of the present invention, there is provided a method of manufacturing a trench MOSFET, having the steps of: growing an epitaxial layer with a first conductivity type upon a heavily doped substrate with a first conductivity type; applying a trench mask and forming a plurality of first gate trenches in active area, at least a second gate trench having wider trench width than said first gate trenches for gate connection, and multiple of third gate trenches in termination area; growing a sacrificial oxide layer onto inner surface of each said first gate trench, each said second gate trench and each said third gate trench to remove the plasma damage; removing said sacrificial oxide and growing or depositing an oxide layer along said inner surface of each said first gate trench, each said second gate trench and each said third gate trench as gate oxide; depositing doped poly-silicon with said first conductivity type into each said first gate trench, each said second gate trench and each said third gate trench; implanting said epitaxial layer with a second conductivity type dopant and diffusing it to form body regions without using body mask; etching back said doped poly-silicon and said gate oxide and within each said first gate trench, each said second gate trench and each said third gate trench to make the top surface of said doped poly-silicon and said gate oxide below the top surface of said body regions; depositing and planarizating another oxide layer functioning as contact interlayer to make it fill into the upper portion of each said first gate trench, each said second gate trench and each said third gate trench and also on top surface of said body regions; applying a contact 1 mask and dry oxide etching to remove part of said contact interlayer from upper portion of each said first gate trench and leaving only a layer wherein; carrying out dopant Ion Implantation of said first conductivity and diffusing for source region formation; removing said contact 1 mask and applying a contact 2 mask; forming at least a body contact trenches and at least a gate contact trench by successively dry oxide etching and dry silicon etching; carrying out dopant Ion Implantation of said second conductivity type with low energy to form a first body contact area within said body region and wrapping at least the bottom of each said body contact trench; carrying out dopant Ion Implantation of said second conductivity type with high energy to form a second body contact area below said first body contact area and activating implanted dopant.

According to a tenth aspect of the present invention, there is provided a method manufacturing a trench MOSFET in which after the formation of said second body contact area, further comprises steps: forming tungsten plug within each said body contact trench and each said gate contact trench, and also in upper portion of each of said first gate trenches; forming source metal and gate metal by patterning front metal of Al alloys or Cu alloys on top surface of said trench MOSFET with metal mask.

According to a eleventh aspect of the present invention, there is provided a method manufacturing a trench MOSFET in which after the formation of said second body contact area, further comprises steps: forming tungsten plugs within each said body contact trench and each said gate contact trench; depositing front metal to refill the upper portion of said first gate trenches and covering the top surface of said trench MOSFET; applying a metal mask and patterning said front metal into source metal and gate metal.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein:

FIG. 3 is channel packing density comparison of closed cell and stripe cell.

DETAILED DESCRIPTION OF THE EMBODIMENTS

Figure 1:
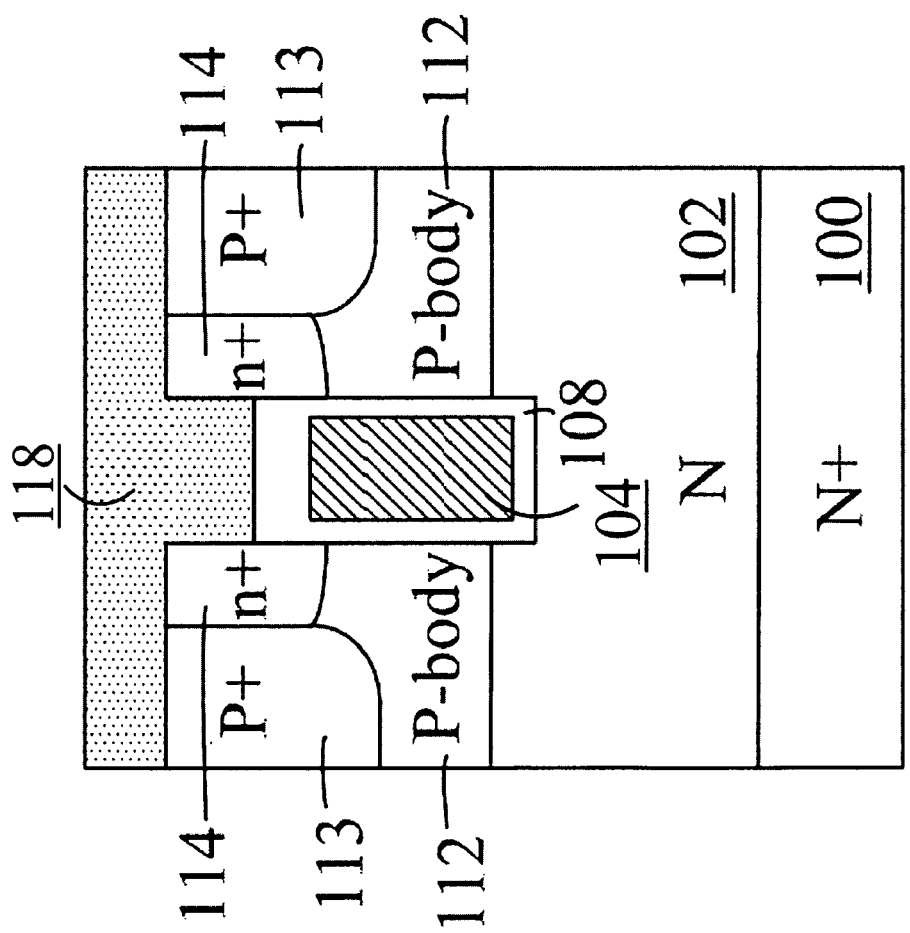
FIG. 1 is a side cross-sectional view of a trench MOSFET of prior art.
Figure 2:
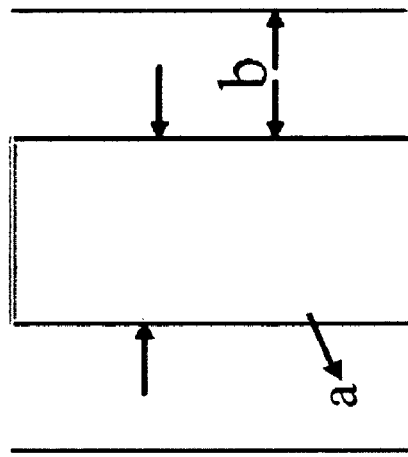
FIG. 2 is channel packing density calculation method of closed cell and stripe cell.
Figure 2:
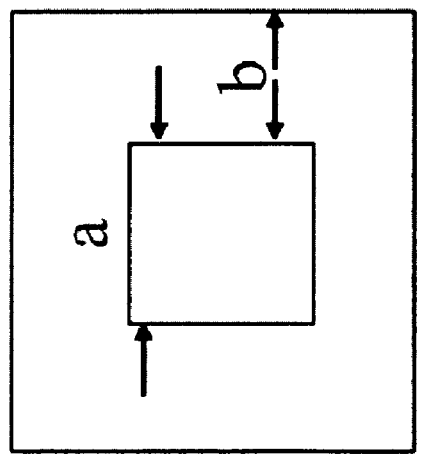
Figure 4:
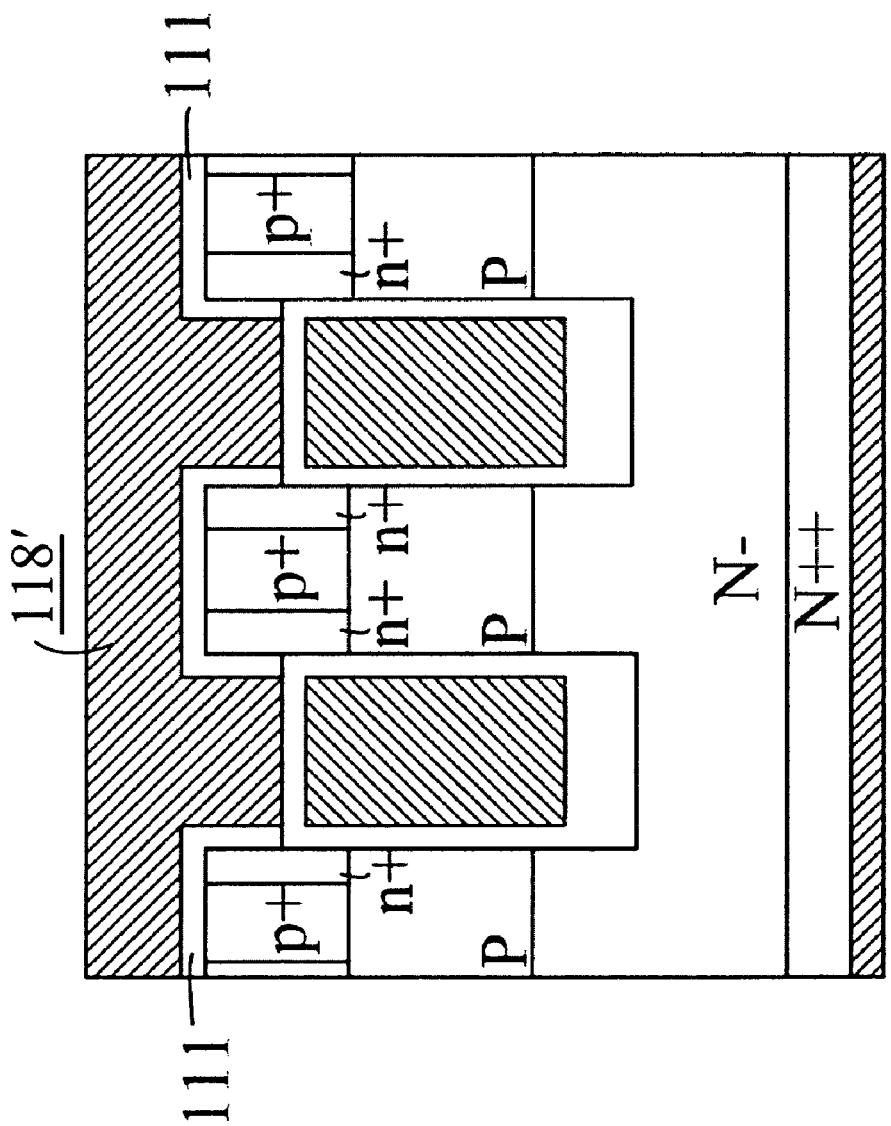
FIG. 4 is a side cross-sectional view of a trench MOSFET of another prior art.
Figure 5:
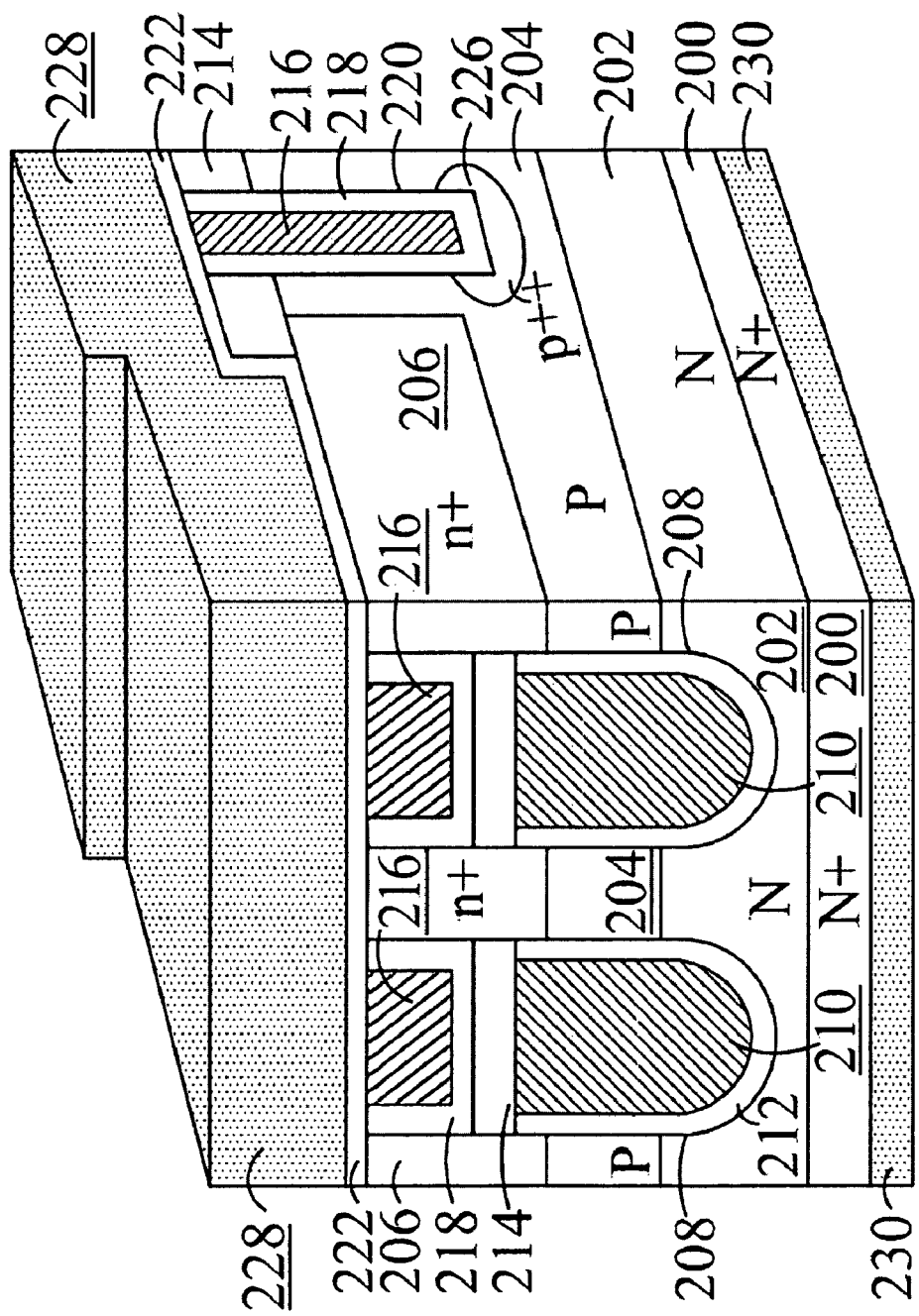
FIG. 5 is a three-dimensional view of a trench MOSFET of a preferred embodiment according to the present invention.

Please refer to FIG. 5 for a three-dimensional view of a preferred N-channel trench MOSFET which formed on an N+ substrate 200 coated with drain metal 230 on its rear side. Onto said N+ substrate, an N epitaxial layer 202 is grown, inside which a plurality of P body regions 204 and a plurality of n+ source regions 206 are successively formed within the active area. A plurality of first gate trenches 208 are formed penetrating through said source regions 206, said body regions 204 and extending into said N epitaxial layer 202, each of said first gate trenches is filled with doped poly-silicon 210 padded by a gate oxide 212 within its lower portion. Above a contact interlayer 214 deposited onto said doped poly-silicon 210, tungsten plug 216 is refilled into the upper portion of each of said first gate trenches 208 and padded by a barrier layer 218 of Ti/TiN or Co/TiN or Ta/TiN. Next to the edge of said active area, at least a body contact trench 220 is formed penetrating through said contact interlayer 214 and extending into the body region 204 just below, each said body contact trench 220 is filled with said tungsten plug 216 padded with said barrier layer 218. Furthermore, underneath bottom of each said body contact trench 220, a P++ body contact area 226 is formed within the body region 204 and wrapping at least the bottom of said body contact trench 220 to further reduce contact resistance. Onto the top of the trench MOSFET, a source metal 228 is formed padded by a resistance reduction layer 222 of Ti or Ti/TiN underneath to contact said source regions 206 on top surface of said source regions and via said tungsten plugs 216 on top portion of sidewalls of each of said first gate trenches 208, meanwhile, said source metal 228 is connected to said body regions 204 by said tungsten plug 216 refilling into each said body contact trench 220.

Figure 6:
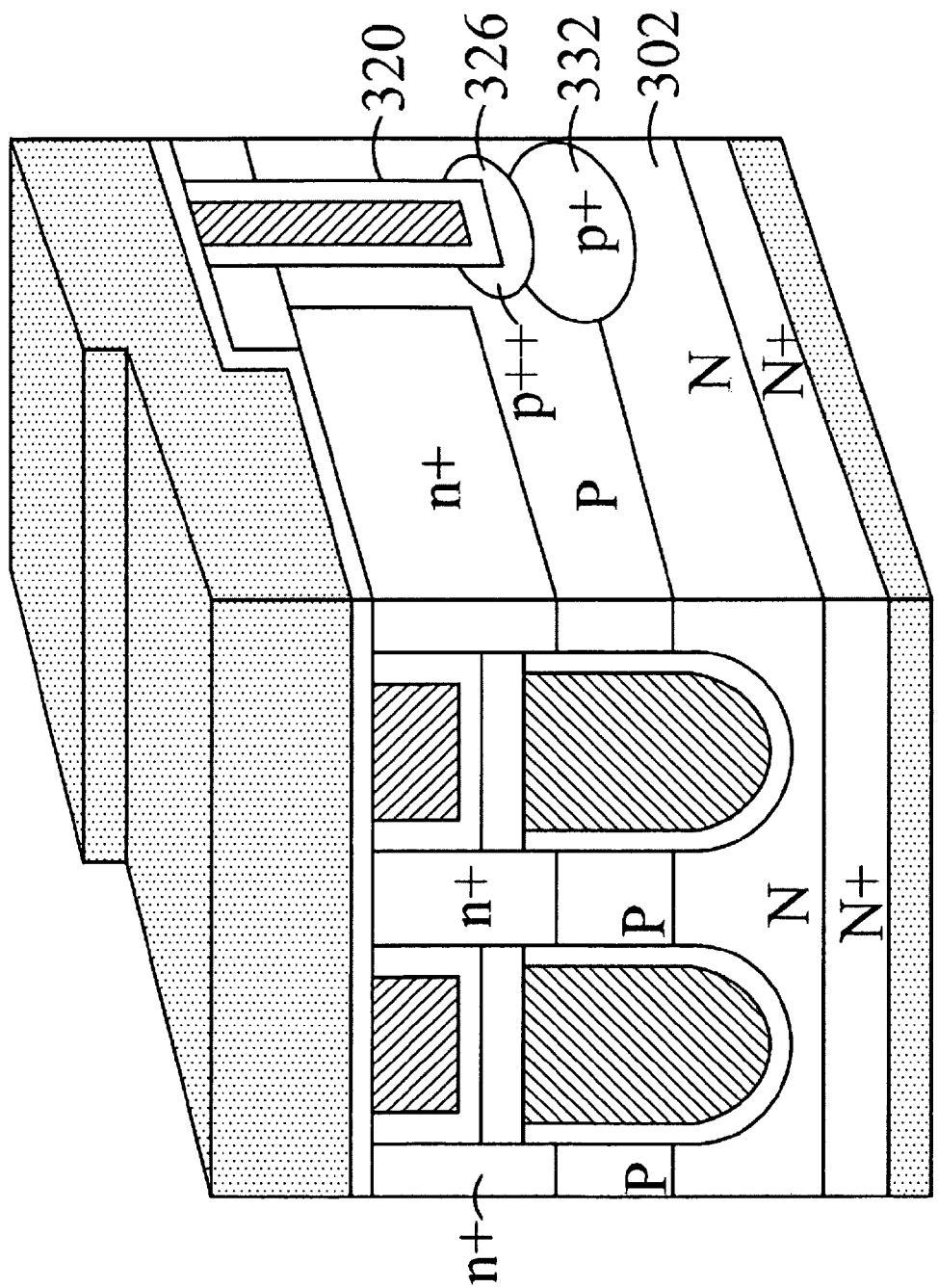
FIG. 6 is a three-dimensional view of a trench MOSFET of another preferred embodiment according to the present invention.

FIG. 6 shows a three-dimensional view of another preferred N-channel trench MOSFET which has a similar structure to FIG. 5 except that, underneath the P++ body contact area 326 wrapping at least the bottom of each said body contact trench 320, another P+ body contact area 332 is formed underneath each said first body contact region and partially into the N epitaxial layer 302 with higher doping concentration than said P body regions but lower doping concentration than said P++ body contact area 326 for avalanche improvement.

Figure 7:
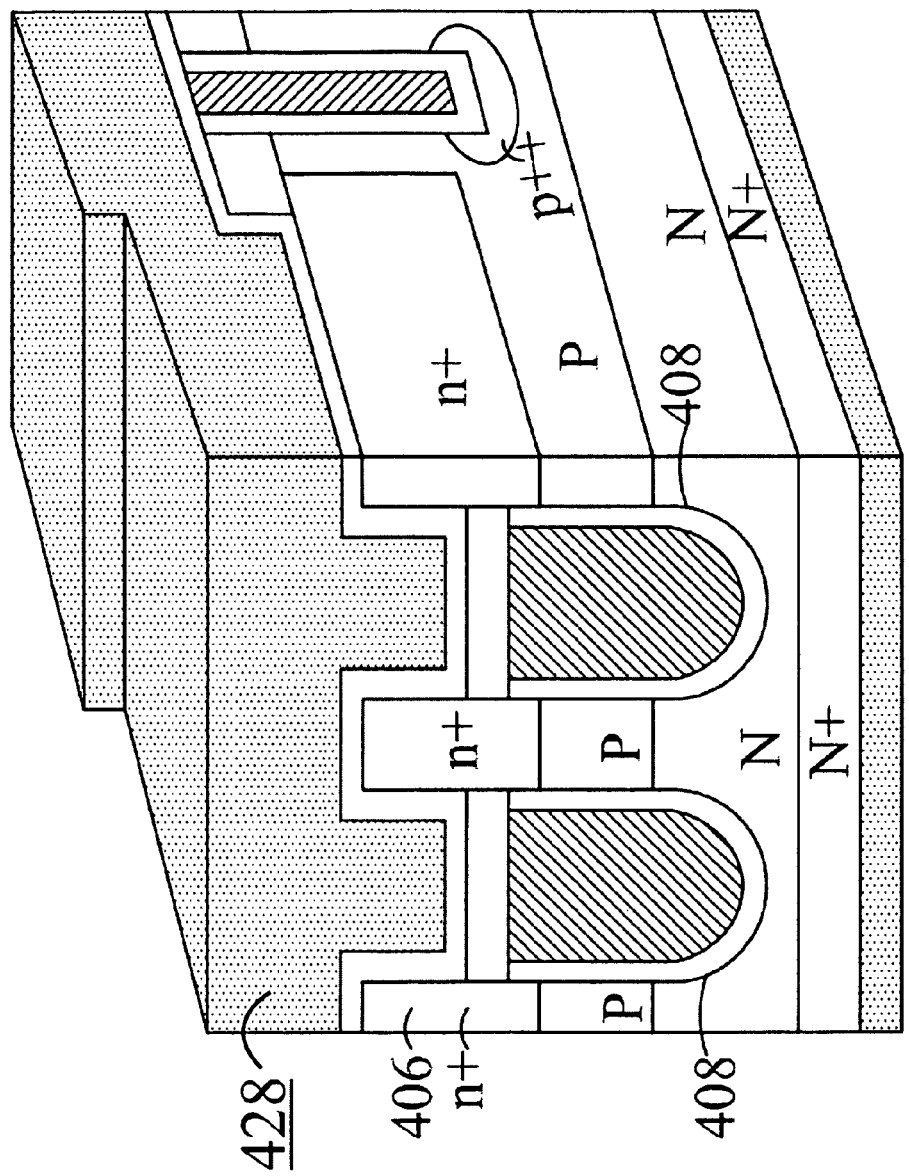
FIG. 7 is a three-dimensional view of a trench MOSFET of another preferred embodiment according to the present invention.

FIG. 7 shows a three-dimensional view of another preferred N-channel trench MOSFET which has a similar structure to FIG. 5 except that, the source metal 428 is directly filling into the upper portion of each of said first gate trenches 408 to contact the source regions 406 on top surface of said source regions and top portion of sidewalls of each of said gate trenches 408.

Figure 8:
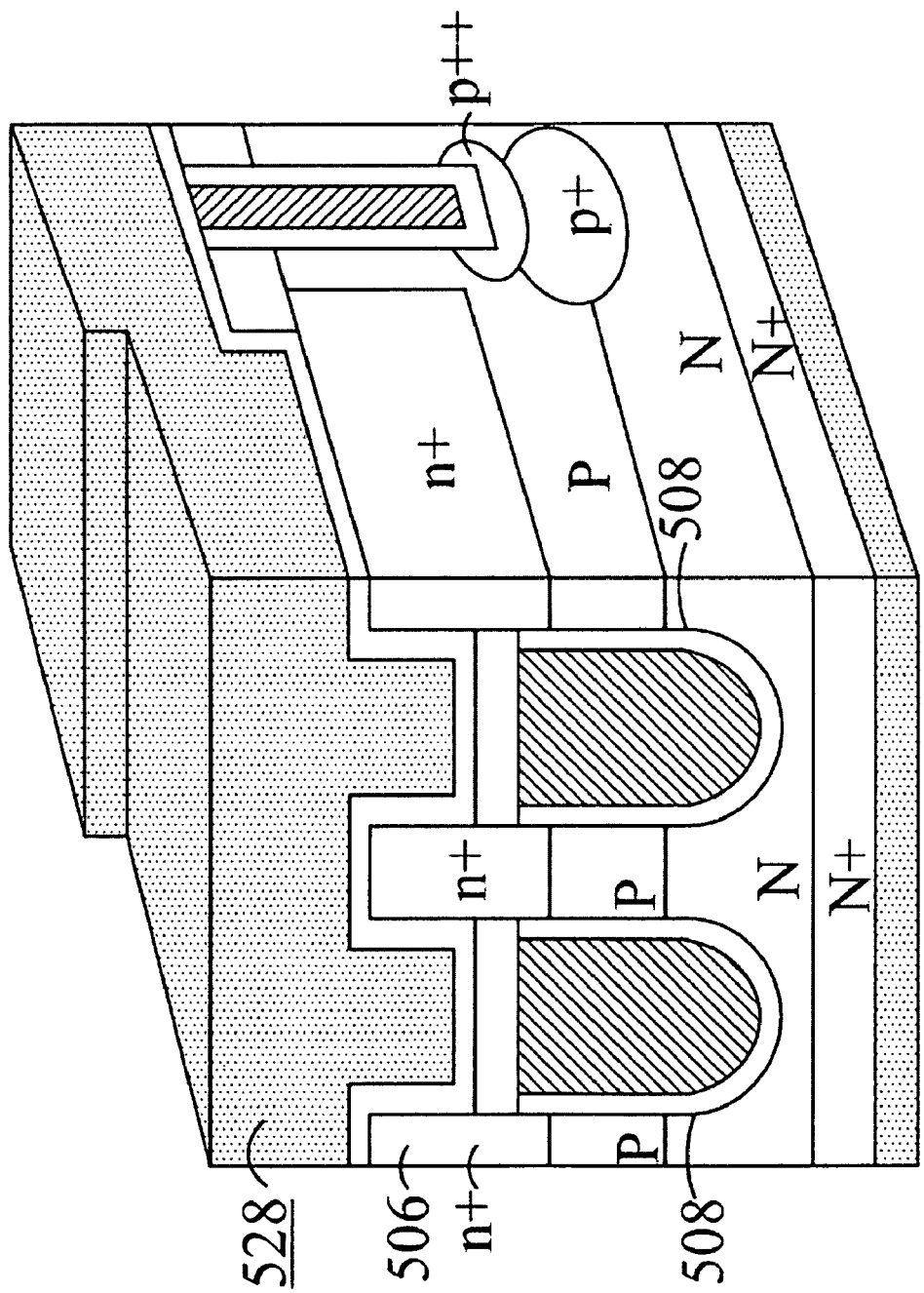
FIG. 8 is a three-dimensional view of a trench MOSFET of another preferred embodiment according to the present invention.

FIG. 8 shows a three-dimensional view of another preferred N-channel trench MOSFET which has a similar structure to FIG. 6 except that, the source metal 528 is directly filling into the upper portion of each of said first gate trenches 508 to contact the source regions 506 on top surface of said source regions and top portion of sidewalls of each of said gate trenches 508.

Figure 9:
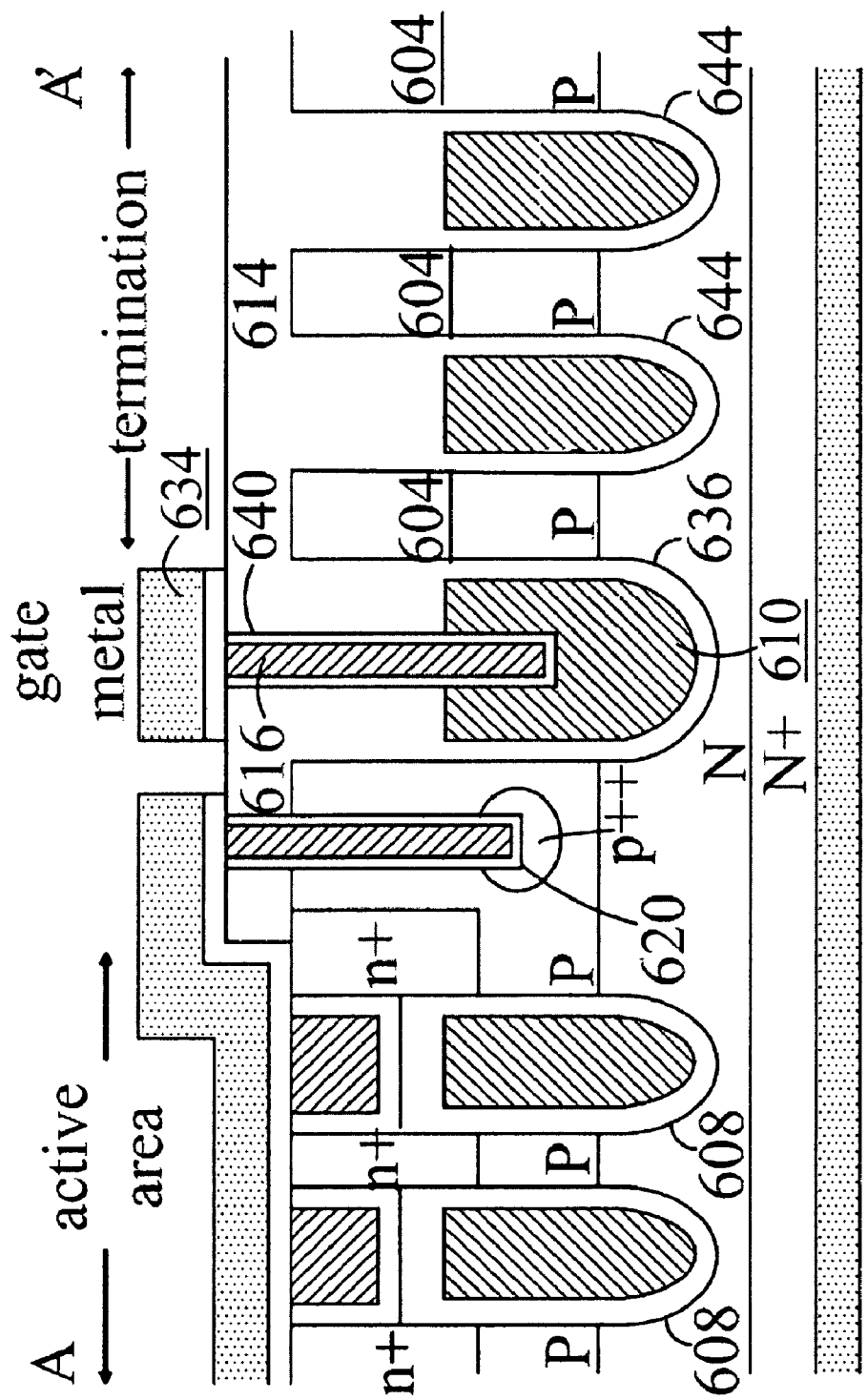
FIG. 9 is a side cross-sectional view of a trench MOSFET with termination area composed of a plurality of trenched gates with floating voltage according to the present invention.
Figure 10:
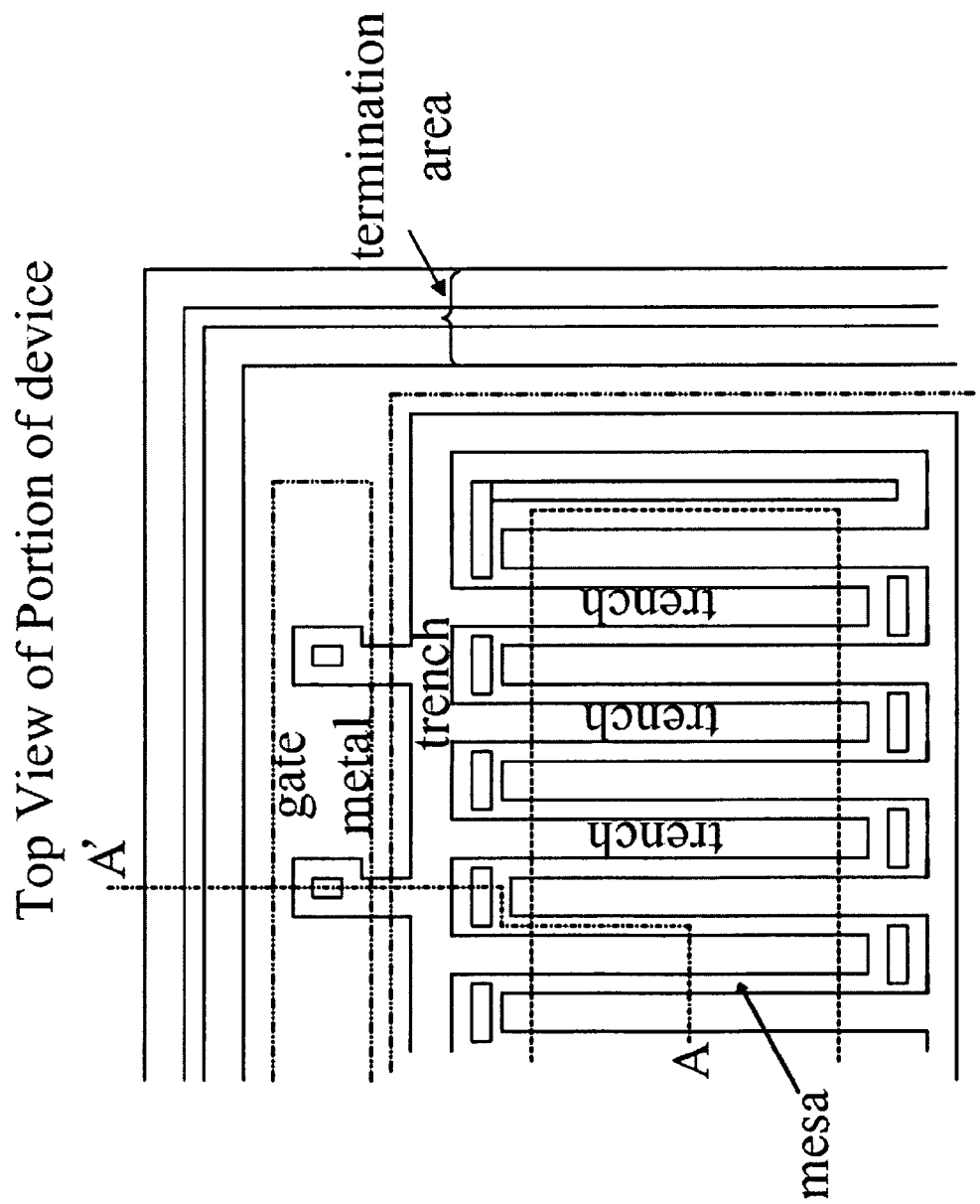
FIG. 10 is a top view of part of trench MOSFET as shown in FIG. 9.

FIG. 9 shows a side cross-sectional view of another preferred N-channel trench MOSFET which is also the A-A' cross section of FIG. 10. Compared to FIG. 5, the structure in FIG. 9 further comprises at least a second gate trench 636 located adjacent to the body contact trench 620 and filled with doped poly-silicon 610 in its lower portion. Said second gate trench 636 has wider trench width than the first gate trenches 608 in the active area, and said doped poly-silicon 610 within said second gate trench 636 is connected to a gate metal 634 by tungsten plugs 616 filled into a gate contact trench which penetrating through the contact interlayer 614 and extending into said doped poly-silicon 610 within said second gate trench 636. Besides, the structure in FIG. 9 further illustrates termination area composed of trenched floating rings comprising a plurality of third gate trenches 644 with each having doped poly-silicon 610 in its lower portion and having contact interlayer 614 in its upper portion without n+ source region in mesa area where-between.

Figure 11:
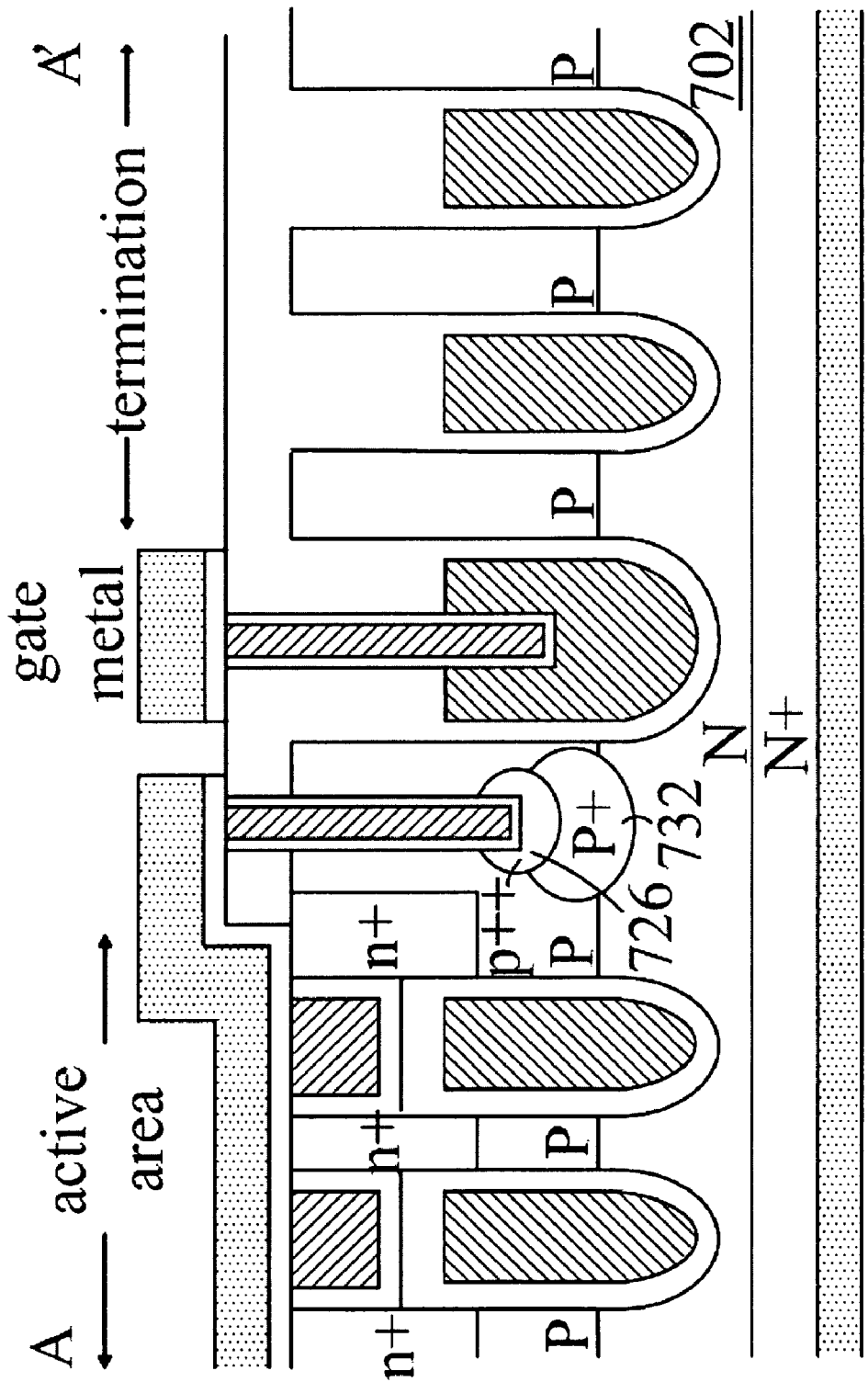
FIG. 11 is a side cross-sectional view of a trench MOSFET with termination area composed of a plurality of trenched gates with floating voltage according to the present invention.

FIG. 11 shows a side cross-sectional view of another preferred N-channel trench MOSFET which has a similar structure to FIG. 9 except that, there is another P+ body contact area 732 introduced below the P++ body contact area 726 to form a clamp diode between the N epitaxial layer 702 and the P+ body contact area 732 for the prevention of triggering parasitic N+(substrate)/P(body)/N(epitaxial layer) inherently.

Figure 12:
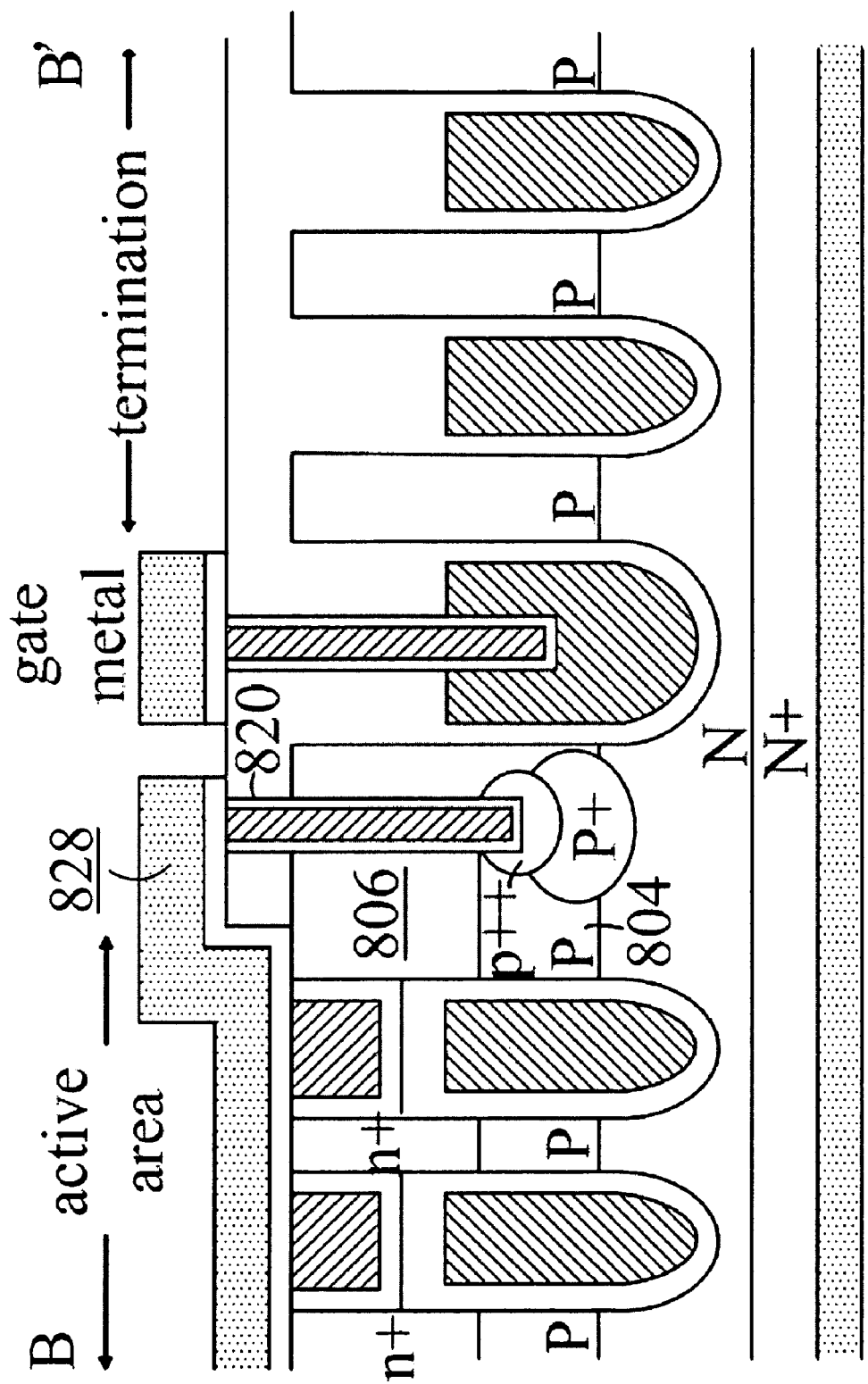
FIG. 12 is a side cross-sectional view of a trench MOSFET with termination area composed of a plurality of trenched gates with floating voltage according to the present invention.
Figure 13:
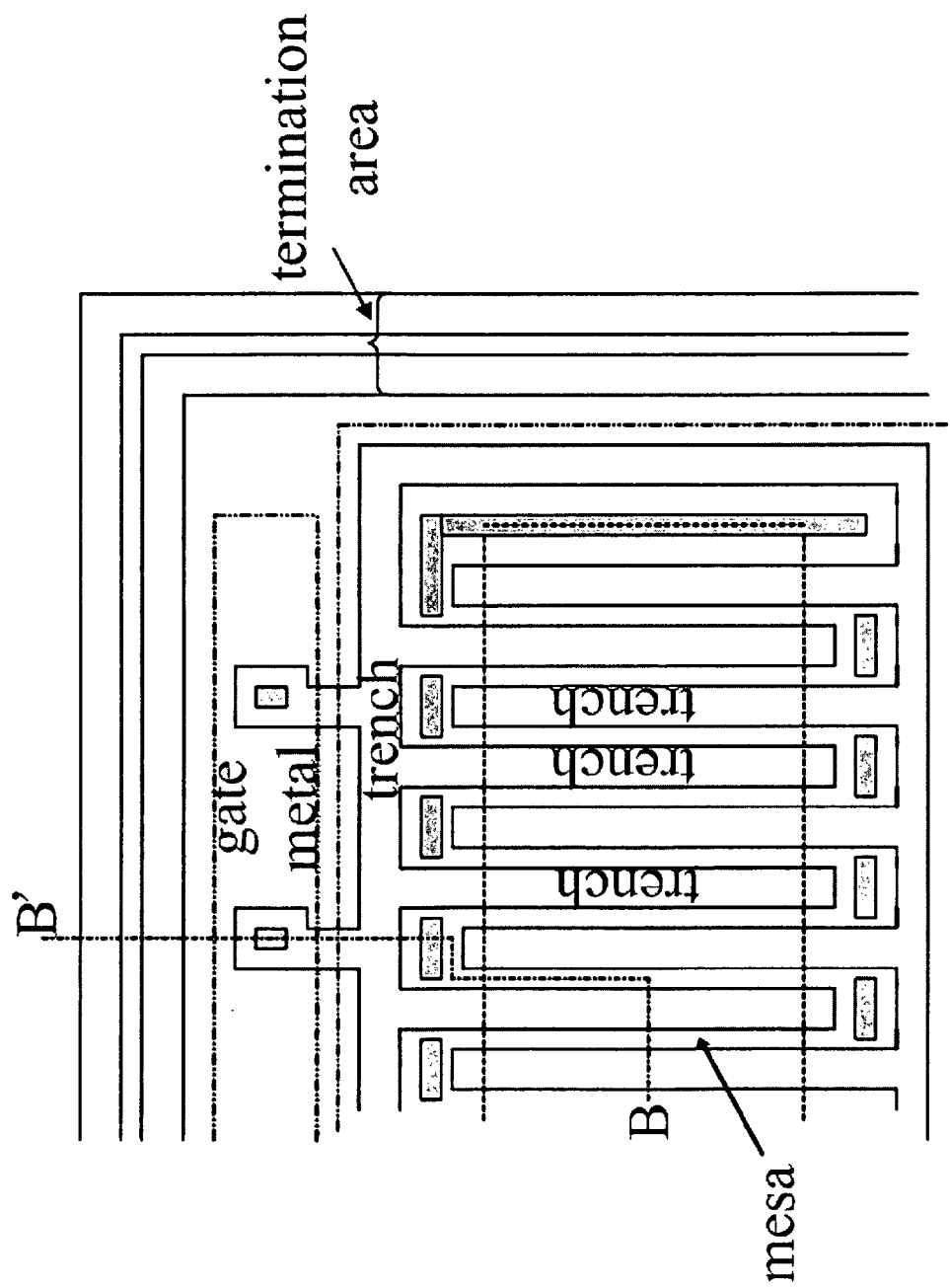
FIG. 13 is a top view of part of trench MOSFET as shown in FIG. 12.

FIG. 12 shows a side cross-sectional view of another preferred N-channel trench MOSFET which is also the B-B' cross section of FIG. 13. The structure in FIG. 12 has a similar structure to FIG. 11 except that, the n+ source region in edge of the active area is reaching the adjacent sidewall of the trenched body contact 820, which means said trenched body contact 820 also connects said n+ source region 806 to source metal 828 together with the body region 804.

Figure 14A:
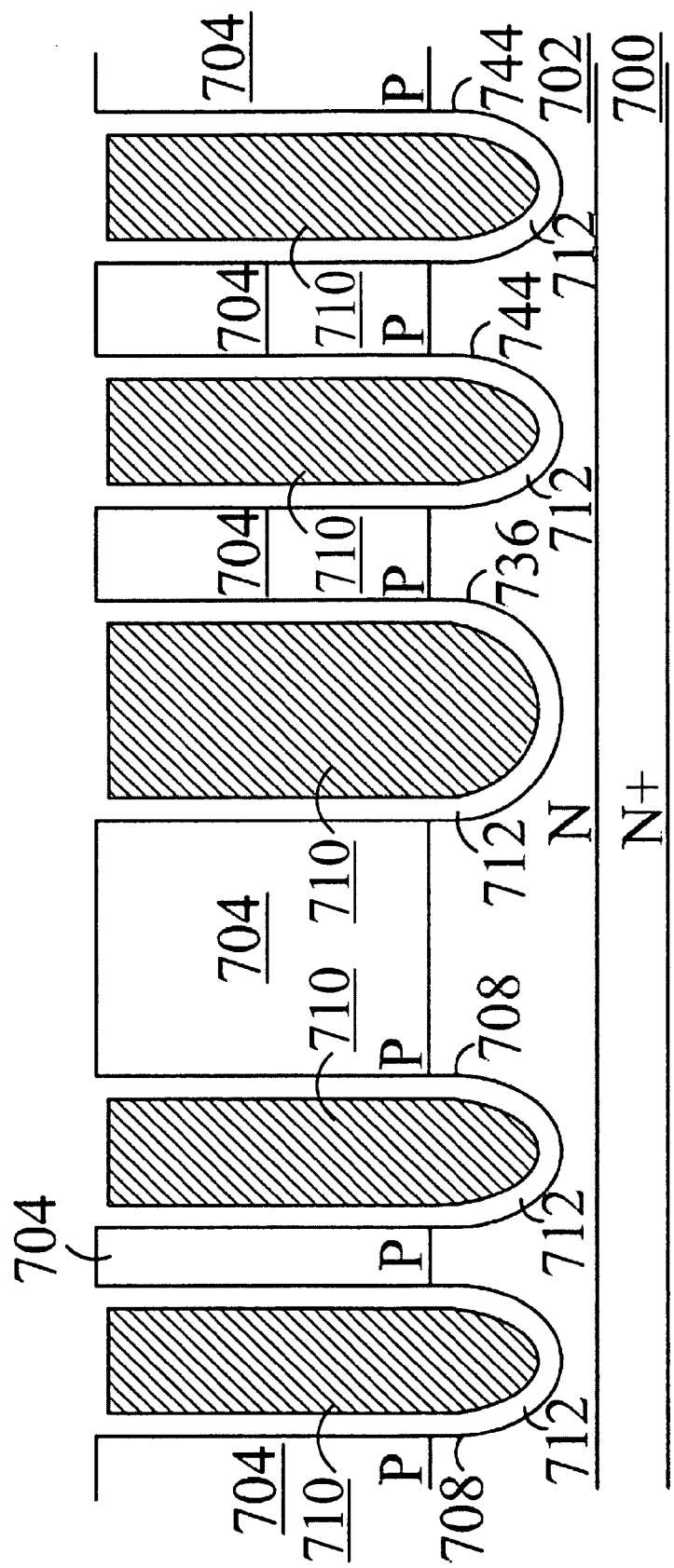
FIGS. 14A~14F are a serial of side cross-sectional views for showing the processing steps for fabricating the trench MOSFET as shown in FIG. 11.

FIGS. 14A to 14E area a serial of exemplary steps that are performed to form the preferred N-channel trench MOSFET shown in FIG. 11. In FIG. 14A, an N doped epitaxial layer 702 is first grown on an N+ substrate 700. After applying a trench mask (not shown), a plurality of trenches are etched to a certain depth into said N epitaxial layer 702 among which including: a plurality of first gate trenches 708 in the active area, at least a second gate trench 736 having wider trench width than others and a plurality of third gate trenches 744 the in termination area. Then, a sacrificial oxide layer is grown and then removed to eliminate the plasma damage may introduced during etching process. Next, a first insulation layer is deposited overlying the inner surface of each of said first gate trenches 708, said second gate trench 736 and said third gate trenches 744 to serve as gate oxide 712, onto which doped poly-silicon 710 is deposited filling those gate trenches and then etched back by CMP (Chemical Mechanical Polishing) or plasma etching. Then, over the entire top surface, a step of P body dopant Ion Implantation is carried out for the formation of P body regions 704 followed by a P body dopant diffusion for drive-in.

Figure 14B:
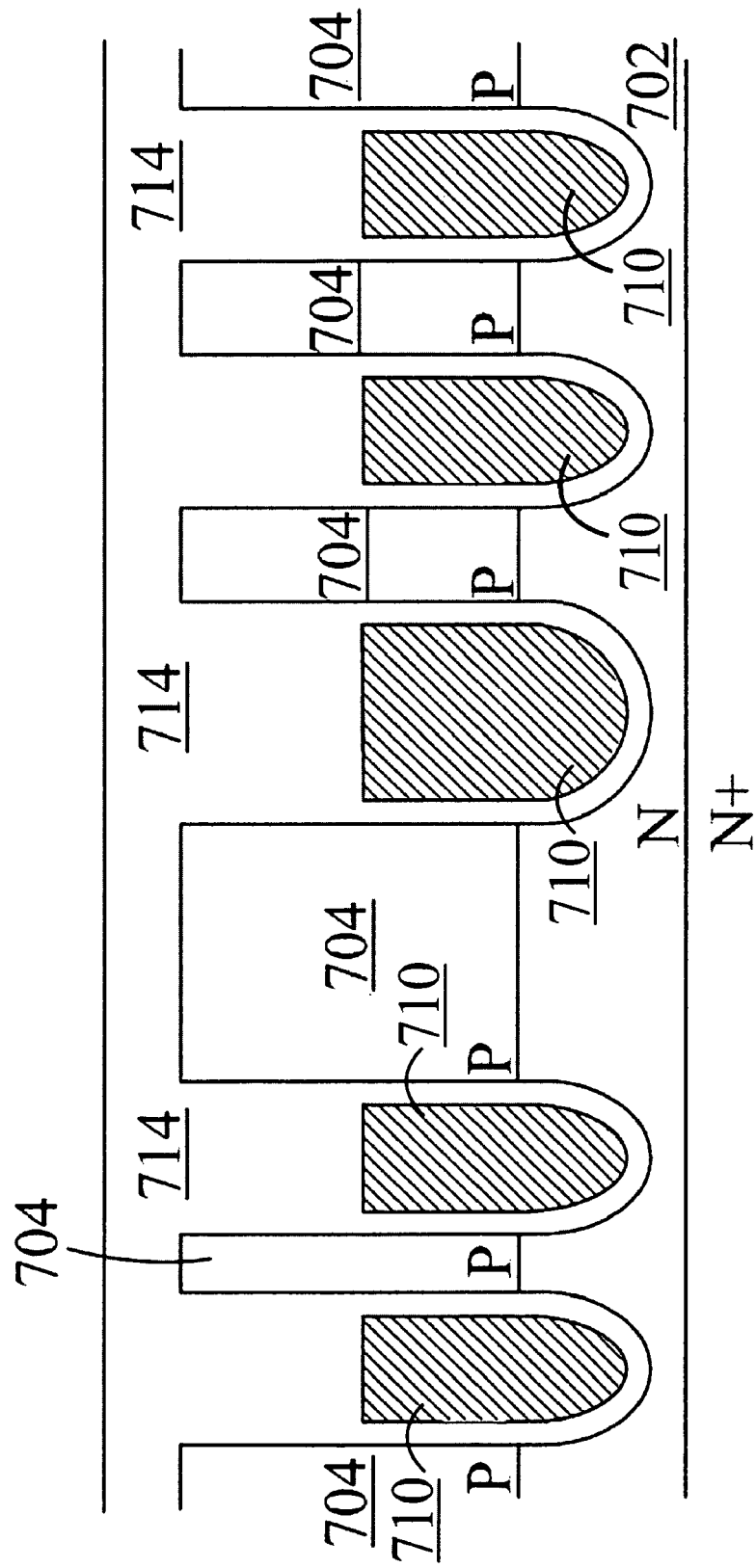

In FIG. 14B, said doped poly-silicon 710 is first etched back making its top surface below top surface of said P body region 704, and then, steps of deposition and planarization of a second insulation layer, for example, oxide layer, are successively carried out to make it fill into the upper portion of those gate trenches and cover the top surface of the mesa between those said gate trenches functioning as contact interlayer 714.

Figure 14C:
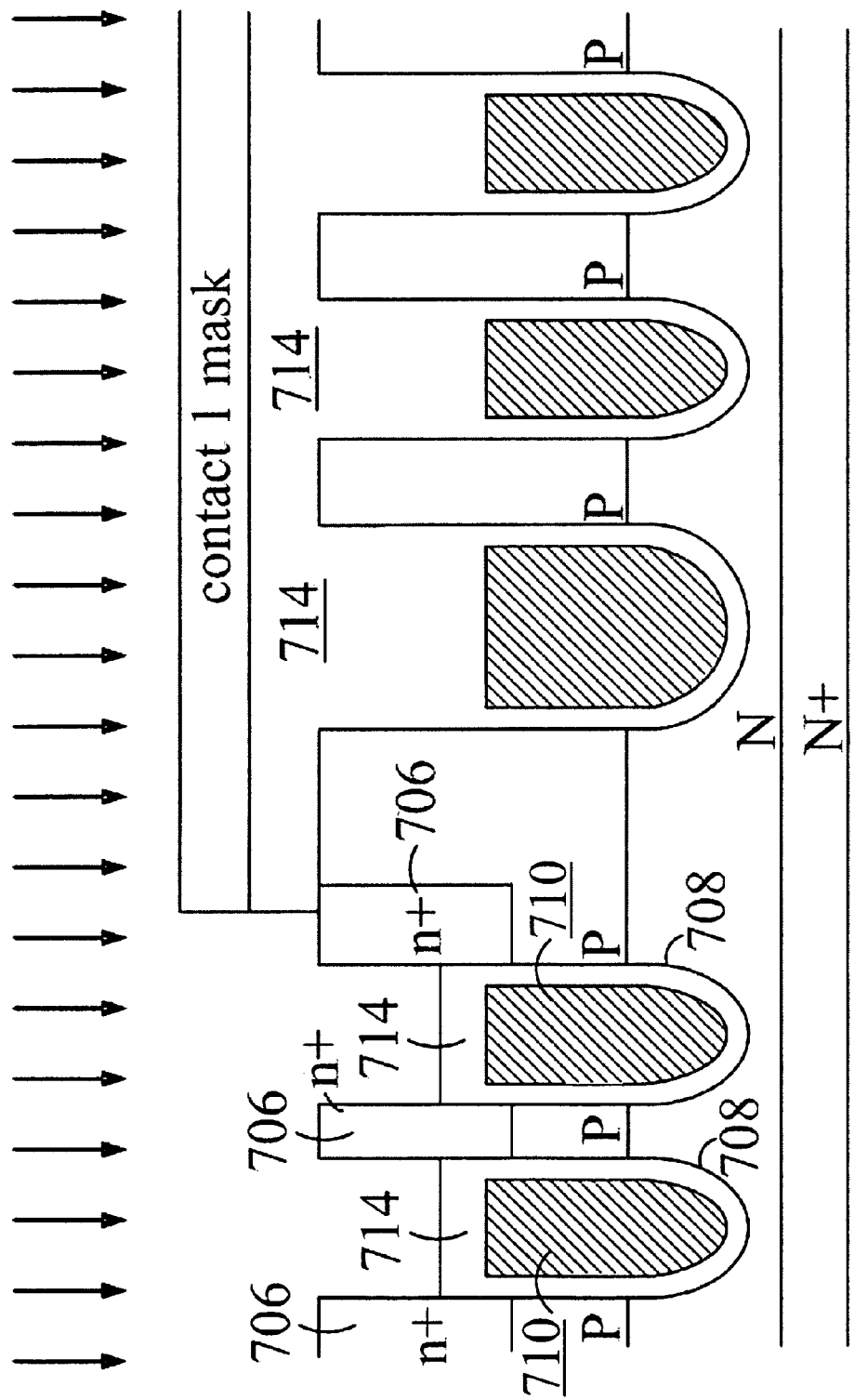

In FIG. 14C, after a contact 1 mask is applied (as shown), said contact interlayer 714 is etched according to the definition of the contact 1 mask by dry oxide etching, leaving only portion of said contact interlayer covering the top surface of doped poly-silicon 710 within said gate trenches 708. Then, a step of n+ source dopant Ion Implantation is carried out over entire surface for the formation of n+ source regions 706 followed by a diffusion of n+ source dopant for drive-in.

Figure 14D:
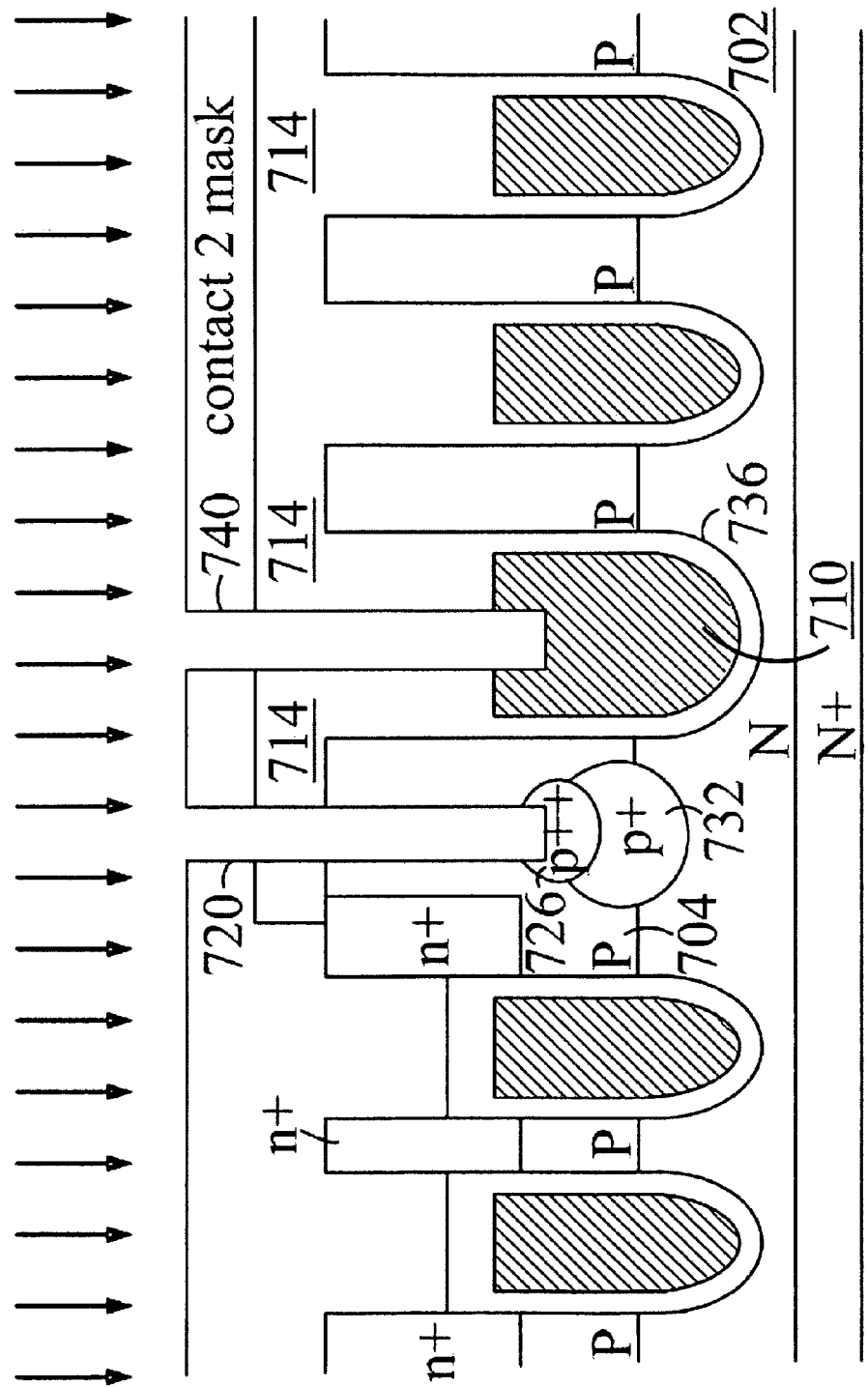

Next, the process continues with removing said contact 1 mask and applying another contact 2 mask, as shown in FIG. 14D. Then, a plurality of contact trenches are etched by successively dry oxide etch and dry silicon etch, among which at least a body contact trench 720 is penetrating through said contact interlayer 714 and extending into the P body region 704 just below, while at least a gate contact trench 740 is penetrating through said contact interlayer 714 and extending into said doped poly-silicon 710 filling into said second gate trench 736. Next, a low energy BF2 Ion Implantation is first carried out to form P++ body contact area 726 encompassed in said body region 704 wrapping at least the bottom of each said body contact trench 720. And then, a high energy Boron Ion Implantation is alternatively performed to form another P+ body contact area 732 underneath said P++ body contact area 726 and partially extending into said N epitaxial layer 702 for avalanche improvement. After that, an RTA (Rapid Thermal Annealing) or diffusion step is carried out for activating those implanted dopant.

Figure 14E:
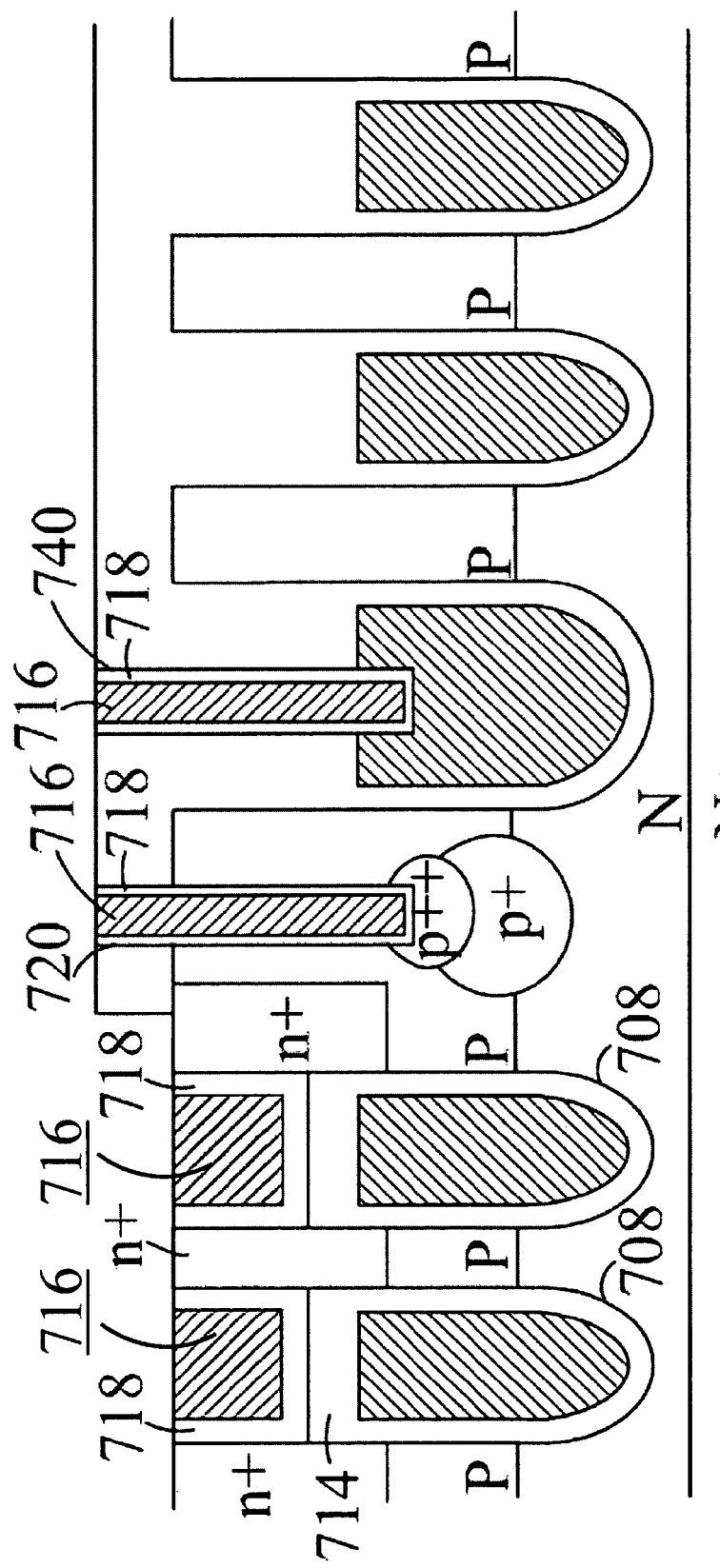

In FIG. 14E, a barrier layer 718 of Ti/TiN or Co/TiN or Ta/TiN is first deposited along the inner surface of said body contact trench 720, said gate contact trench 740, the upper sidewalls of said first gate trenches 708 and the top surface of said contact interlayer 714 within said first gate trenches 708. Then, after performing a step of RTA, metal tungsten is deposited and then etched back to form tungsten plugs 716 filling into the upper portion of said first gate trenches 708, said body contact trench 720 and said gate contact trench 740.

Figure 14F:
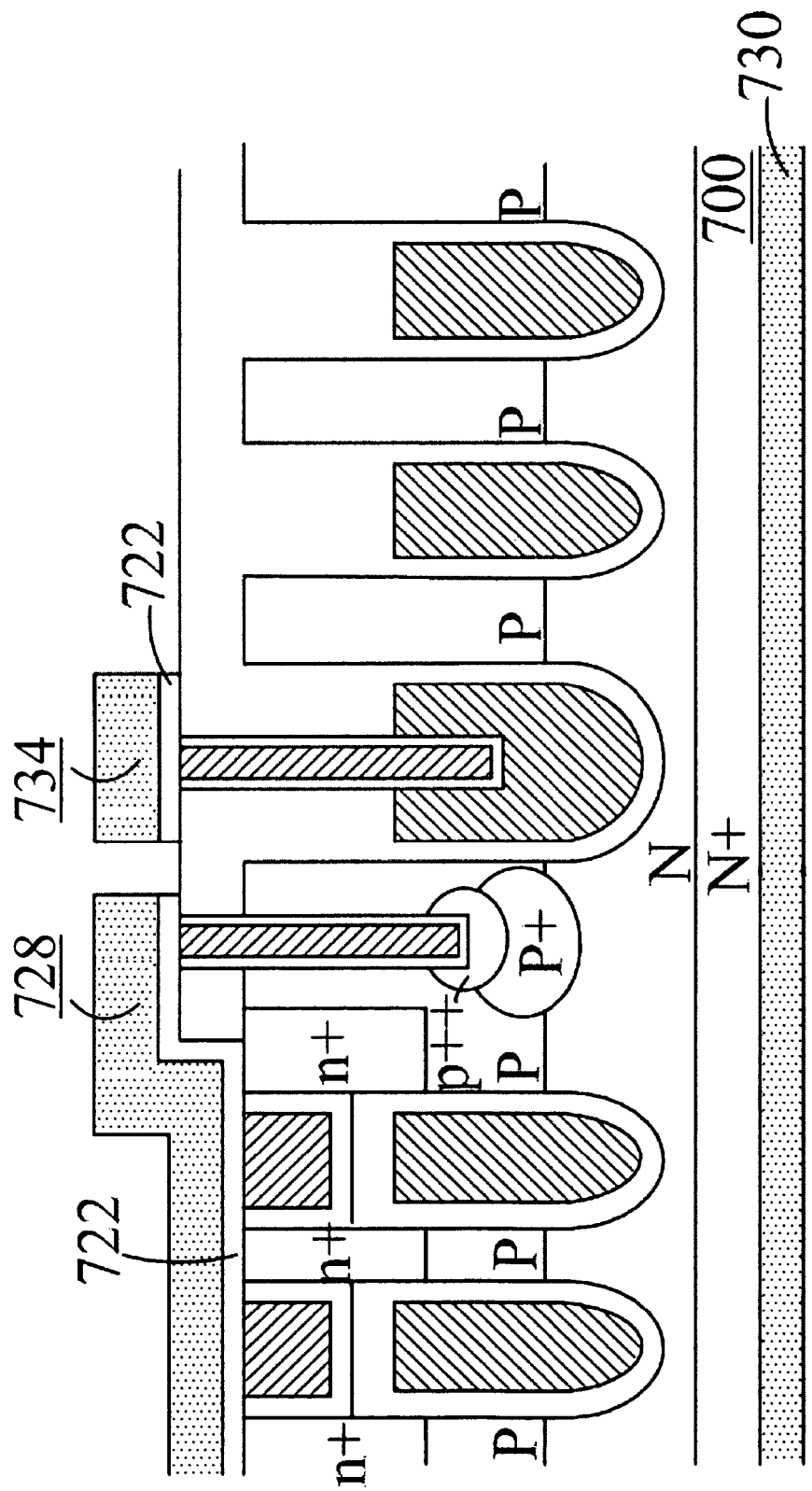

In FIG. 14F, a front metal of Al alloys or Cu alloys is deposited over entire top surface of the trench MOSFET padded by a resistance-reduction layer 722, then after applying a metal mask (not shown), said front metal and said resistance reduction layer 722 is patterned to form source metal 728 and gate metal 734 by metal etch. Last, after the backside grinding, back metal of Ti/Ni/Ag is deposited onto rear side of said substrate 700 to function as drain metal 730.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A trench semiconductor power MOSFET comprising a plurality of trench MOSFET of stripe cells with each stripe cell comprising:
    a substrate of a first conductivity type;
    an epitaxial layer of said first conductivity type over said substrate and having a lower doping concentration than said substrate;
    a plurality of body regions of a second conductivity type inside said epitaxial layer;
    a plurality of source regions of said first conductivity type near top surface of said body regions in an active area and having a higher doping concentration than said epitaxial layer;
    a plurality of first gate trenches reaching said epitaxial layer and surrounded by said source regions above said body regions, and each cell only have said source region and said body region between two adjacent first trenched gates;
    a first insulation layer lining the lower inner surface of said first gate trenches;
    a gate conductive layer filling partially within lower portion of each of said first gate trenches and close to said first insulation layer;
    a second insulation layer disposed inside of upper portion of said first gate trenches covering top surface of said gate conductive layer and said first insulation layer, and on top surface of said epitaxial layer;
    at least a body contact trench arranged next to the edge of said active area penetrating through said second insulation layer and extending into said body region;
    a first body contact region heavily doped with said second conductivity type inside said body region and wrapping at least the bottom of each said body contact trench, said first body contact region has a higher doping concentration than said body region;
    a first metal plug filling into upper portion of each of said first gate trenches;
    a second metal plug filling into each said body contact trench;
    a source metal connected to said source region on top of said source region and on sidewalls of top portion of said first gate trenches via said first metal plug, while connected to said body region via said second metal plugs filling in said body contact trench.

2. The MOSFET of claim 1 further comprises at least a second gate trenches having wider trench width than said first gate trenches, each of said second gate trenches is filled with said gate conductive layer padded by said first insulation layer within its lower portion while refilled with said second insulation layer in its upper portion.

3. The MOSFET of claim 2 further comprises at least a gate contact trench penetrating through said second insulation layer and extending into said gate conductive layer within said second gate trench, said gate contact trench is refilled with said second metal plug for connecting said gate conductive layer within said second gate trench to a gate metal.

4. The MOSFET of claim 1 further comprises a termination area composed of trenched floating rings comprising multiple of third gate trenches, each of said third gate trenches is filled with said gate conductive layer padded by said first insulation layer within its lower portion while filled with said second insulation layer in its upper portion.

5. The MOSFET of claim 1 further comprises a second body contact region underneath each of said first body contact region and partially into said epitaxial layer, said second body contact region has lower doping concentration than said first body contact region but has higher doping concentration than said body region.

6. The MOSFET of claim 1, wherein said source region in edge of said active are is reaching the sidewalls of said body contact trench.

7. The MOSFET of claim 1, wherein said source region in edge of said active area is not reaching the sidewalls of body contact trench.

8. The MOSFET of claim 1, wherein said first metal plug is tungsten plug padded by a barrier layer of Ti/TiN or Co/TiN or Ta/TiN.

9. The MOSFET of claim 1, wherein said second metal plug is tungsten plug padded by a barrier layer of Ti/TiN or Co/TiN or Ta/TiN.

10. The MOSFET of claim 1, wherein said first metal plug is source metal which is directly filling into the upper portion of said first gate trenches.

11. The MOSFET of claim 10, wherein said source metal is padded by a barrier layer of Ti/TiN or Co/TiN or Ta/TiN.

12. The MOSFET of claim 8, wherein said source metal is padded by a resistance reduction layer Ti or Ti/TiN between said source metal and top surface of said source regions and said first metal plugs.

13. The MOSFET of claim 1, wherein said gate conductive layer is doped poly-silicon of said first conductivity type.

14. The MOSFET of claim 1, wherein said first insulation layer is oxide layer serving as gate oxide.

15. The MOSFET of claim 1, wherein said second insulation layer is oxide layer serving as contact interlayer.

* * * * *